United States Patent
Feng

(10) Patent No.: US 10,923,509 B2
(45) Date of Patent: Feb. 16, 2021

(54) THIN FILM TRANSISTOR ARRAY SUBSTRATE AND DISPLAY PANEL

(71) Applicant: Wuhan China Star Optoelectronics Semiconductor Display Technology Co., Ltd., Wuhan (CN)

(72) Inventor: Xiaoliang Feng, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/477,887

(22) PCT Filed: Dec. 25, 2018

(86) PCT No.: PCT/CN2018/123345
§ 371 (c)(1),
(2) Date: Jul. 14, 2019

(87) PCT Pub. No.: WO2020/113707
PCT Pub. Date: Nov. 6, 2020

(65) Prior Publication Data
US 2020/0176479 A1    Jun. 4, 2020

(30) Foreign Application Priority Data
Dec. 4, 2018   (CN) .......................... 2018 1 1473600

(51) Int. Cl.
*H01L 27/12*      (2006.01)
(52) U.S. Cl.
CPC ........ *H01L 27/124* (2013.01); *H01L 27/1248* (2013.01)

(58) Field of Classification Search
CPC ............ H01L 27/118; H01L 27/11803; H01L 27/11868; H01L 27/11874; H01L 27/11875; H01L 27/11879; H01L 27/11881; H01L 27/11883; H01L 27/11885; H01L 27/11888;
(Continued)

(56) References Cited

U.S. PATENT DOCUMENTS 7,652,359 B2 * 1/2010 Takayama ............ G06K 19/077
                                                        257/679
2005/0041002 A1 * 2/2005 Takahara .............. H01L 27/127
                                                        345/76

(Continued)

FOREIGN PATENT DOCUMENTS

| CN | 103091885 | 5/2013 |
| CN | 104134429 | 11/2014 |

(Continued)

*Primary Examiner* — Eduardo A Rodela

(57) ABSTRACT

A thin film transistor (TFT) array substrate and a display panel are provided in the present application. The TFT array substrate includes a plurality of gate signal lines, a plurality of source signal lines, a plurality of gate traces, the gate traces including a plurality of first gate traces, a plurality of second gate traces, a plurality of first gate trace holes, and a plurality of second gate trace holes; a plurality of source traces, the source traces including a plurality of first source traces, a plurality of second source traces, a plurality of first source trace holes, and a plurality of second source trace holes connecting the source signal lines and the first source traces.

18 Claims, 2 Drawing Sheets

(58) Field of Classification Search
CPC ........... H01L 27/11887; H01L 27/1214; H01L 27/124; H01L 27/1248
See application file for complete search history.

(56) References Cited

U.S. PATENT DOCUMENTS

| | | | |
|---|---|---|---|
| 2007/0114530 A1* | 5/2007 | Kimura | G09G 3/3225 |
| | | | 257/59 |
| 2013/0076716 A1 | 3/2013 | Lim et al. | |
| 2016/0020224 A1* | 1/2016 | Kawamura | H01L 27/1248 |
| | | | 345/213 |
| 2016/0293128 A1* | 10/2016 | Kawamura | G09G 3/3674 |
| 2016/0300854 A1* | 10/2016 | Kawamura | G02F 1/136227 |
| 2017/0033123 A1 | 2/2017 | Lv et al. | |
| 2018/0336815 A1* | 11/2018 | Lin | G06F 3/0412 |
| 2019/0033673 A1 | 1/2019 | Chen | |

FOREIGN PATENT DOCUMENTS

| | | |
|---|---|---|
| CN | 104977740 | 10/2015 |
| CN | 106200176 | 12/2016 |
| CN | 106773415 | 5/2017 |
| CN | 106932980 | 7/2017 |
| CN | 108649035 | 10/2018 |

* cited by examiner

THIN FILM TRANSISTOR ARRAY SUBSTRATE AND DISPLAY PANEL

RELATED APPLICATIONS

This application is a National Phase of PCT Patent Application No. PCT/CN2018/123345 having International filing date of Dec. 25, 2018, which claims the benefit of priority of Chinese Patent Application No. 201811473600.4 filed on Dec. 4, 2018. The contents of the above applications are all incorporated by reference as if fully set forth herein in their entirety.

FIELD AND BACKGROUND OF THE INVENTION

The present invention relates to the field of display technologies, and in particular, to a thin film transistor array substrate and a display panel.

In recent years, with the development of intelligent terminals, users have higher appearance requirements of electronic display devices. Displays and mobile devices with narrow frames and high screen ratios are more popular among users. Screen ratio is one of the earliest concepts used to indicate the relative ratio of the area of display areas of mobile devices to the area of front panels. It is a parameter that is easy to obtain visual preference in the design of mobile devices.

For liquid crystal displays (LCDs), in order to realize display functions, it is necessary to dispose connection traces inside display panels, so that control circuits can be connected to the thin film transistor (TFT) layers of display screens to realize display control. Typically, the connection traces are located in non-display regions outside display regions of the display panels. At present, in most display devices, the area occupied by the connection traces is usually about 5% to 10% of the areas of the display panels, which is difficult to be further reduced. This results in a mobile device's screen ratio that cannot be further reduced, and the users' requirement for "full screens" cannot be achieved.

Therefore, it is necessary to reduce the area occupied by the connection traces on the display panel to further increase the screen ratio of the display device.

SUMMARY OF THE INVENTION

The present application provides a thin film transistor (TFT) array substrate to solve the technical problem that the screen ratio of the display panel cannot be further improved.

In order to solve the above problems, the technical solutions provided by the present application are as follows.

A TFT array substrate, wherein the TFT array substrate includes:

a plurality of gate signal lines, the gate signal lines being disposed in a first planar layer and parallel to each other;

a plurality of source signal lines, the source signal lines being disposed in a second planar layer and parallel to each other, the source signal lines being perpendicular to the gate signal lines;

a plurality of gate traces, the gate traces including a plurality of first gate traces in the first planar layer, a plurality of second gate traces in the second planar layer, a plurality of first gate trace holes electrically connecting the first gate traces and the second gate traces, and a plurality of second gate trace holes electrically connecting the gate signal lines and the first gate traces;

a plurality of source traces, the source traces including a plurality of first source traces in the first planar layer, a plurality of second source traces in the second planar layer, a plurality of first source trace holes connecting the first source traces and the second source traces, and a plurality of second source trace holes connecting the source signal lines and the first source traces.

According to one aspect of the application, the first gate traces are disposed in parallel with the gate signal lines and are electrically insulated from the gate signal lines; the second gate traces are disposed in parallel with the source signal lines and are electrically insulated from the source signal lines.

According to one aspect of the application, the first source traces are disposed in parallel with the gate signal lines and are electrically insulated from the gate signal lines; the second source traces are disposed in parallel with the source signal lines and are electrically insulated from the source signal lines.

According to one aspect of the application, the first gate trace holes are electrically insulated from each other and penetrate an insulating layer between the first gate traces and the second gate traces to implement the electrical connection between the first gate traces and the second gate traces and to form the gate traces.

According to one aspect of the application, the first source trace holes are electrically insulated from each other and penetrate an insulating layer between the first source traces and the second source traces to implement the electrical connection between the first source traces and the second source traces.

According to one aspect of the application, the second gate trace holes are electrically insulated from each other and penetrate an insulating layer between the first gate traces and the gate signal lines to implement the electrical connection between the first gate traces and the gate signal lines.

According to one aspect of the application, the second source trace holes are electrically insulated from each other and penetrate an insulating layer between the first source traces and the source signal lines to implement the electrical connection between the first source traces and the source signal lines.

According to one aspect of the application, the TFT array substrate further includes a bonding region and a plurality of ground traces, wherein an end of each of the gate traces is electrically connected to one of the gate signal lines, and the other end thereof extends into the bonding region, and an end of each of the source traces is electrically connected to one of the source signal lines, and the other end thereof extends into the bonding region;

the ground traces are extended from bases of the TFT array substrate and extend along an edge of the TFT array substrate to the bonding region.

According to one aspect of the application, a number of the source signal lines is equal to a number of source traces, and a number of the gate signal lines is equal to a number of the gate traces.

Correspondingly, the present application further provides a display panel, wherein the display panel includes a TFT array substrate, the TFT array substrate includes:

a plurality of gate signal lines, the gate signal lines being disposed in a first planar layer and parallel to each other;

a plurality of source signal lines, the source signal lines being disposed in a second planar layer and parallel to each other, the source signal lines being perpendicular to the gate signal lines;

a plurality of gate traces, the gate traces including a plurality of first gate traces in the first planar layer, a plurality of second gate traces in the second planar layer, a plurality of first gate trace holes electrically connecting the first gate traces and the second gate traces, and a plurality of second gate trace holes electrically connecting the gate signal lines and the first gate traces;

a plurality of source traces, the source traces including a plurality of first source traces in the first planar layer, a plurality of second source traces in the second planar layer, a plurality of first source trace holes electrically connecting the first source traces and the second source traces, and a plurality of second source trace holes electrically connecting the source signal lines and the first source traces.

According to one aspect of the application, the first gate traces are disposed in parallel with the gate signal lines and are electrically insulated from the gate signal lines, and the second gate traces are disposed in parallel with the source signal lines and are electrically insulated from the source signal lines.

According to one aspect of the application, the first source traces are disposed in parallel with the gate signal lines and are electrically insulated from the gate signal lines; the second source traces are disposed in parallel with the source signal lines and are electrically insulated from the source signal lines.

According to one aspect of the application, the first gate trace holes are electrically insulated from each other and penetrate an insulating layer between the first gate traces and the second gate traces to implement the electrical connection between the first gate traces and the second gate traces and to form the gate traces.

According to one aspect of the application, the first source trace holes are electrically insulated from each other and penetrate an insulating layer between the first source traces and the second source traces to implement the electrical connection between the first source traces and the second source traces.

According to one aspect of the application, the second gate trace holes are electrically insulated from each other and penetrate an insulating layer between the first gate traces and the gate signal lines to implement the electrical connection between the first gate traces and the gate signal lines.

According to one aspect of the application, the second source trace holes are electrically insulated from each other and penetrate an insulating layer between the first source traces and the source signal lines to implement the electrical connection between the first source traces and the source signal lines.

According to one aspect of the application, the display panel further includes a bonding region and a plurality of ground traces, wherein an end of each of the gate traces is electrically connected to one of the gate signal lines, and the other end thereof extends into the bonding region, and an end of each of the source traces is electrically connected to one of the source signal lines, and the other end extends into the bonding region;

the ground traces are extended from bases of the display panel and extend along an edge of the display panel to the bonding region.

According to one aspect of the application, a number of the source signal lines is equal to a number of the source traces; a number of the gate signal lines is equal to a number of the gate traces.

Beneficial Effect

The present application utilizes the wiring pattern of the existing gate data line and the source data line, and sets the gate traces and the source traces between the plurality of gate data lines and the plurality of source data lines respectively. Therefore, the gate traces and the source traces in the non-display region at the edge of the display panel can be disposed in the display region, which can further reduce the area of the non-display region, and greatly increase the screen ratio of the display panel.

DESCRIPTION OF SPECIFIC EMBODIMENTS OF THE INVENTION

Figure 1:
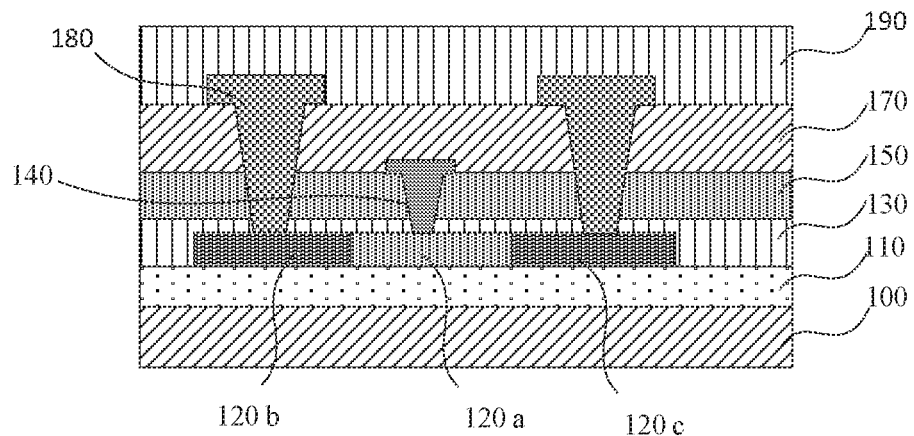
FIG. 1 is a structural diagram of a transistor of a thin film transistor (TFT) array substrate of the present invention.

Description of following embodiment, with reference to accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to orientation of the accompanying drawings. Therefore, the directional terms are intended to illustrate, but not to limit, the present disclosure. In the drawings, components having similar structures are denoted by same numerals.

Figure 2:
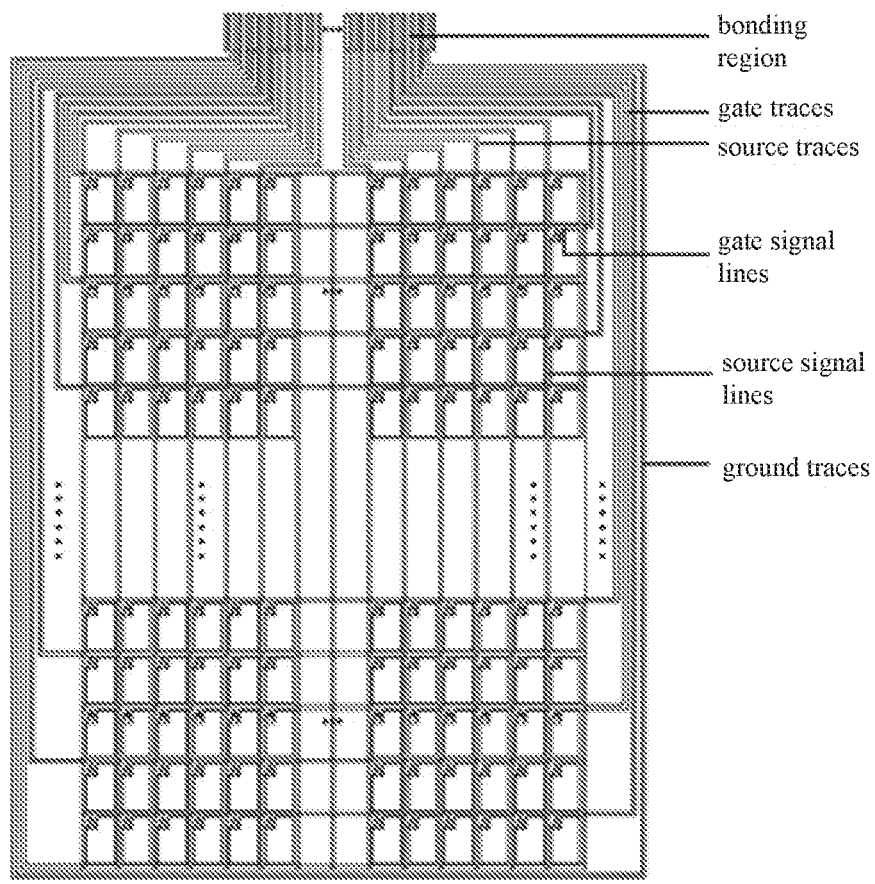
FIG. 2 is a structural diagram of a transistor of a TFT array substrate of prior art.

First, prior art will be briefly described. Referring to FIG. 2, FIG. 2 is a structural diagram of a transistor of a thin film transistor (TFT) array substrate of prior art. In prior art, gate data lines of the TFT array are parallel to each other and are led out from both ends to connect to gate traces located in a non-display region of a display panel respectively. Source data lines of the TFT array are parallel to each other while being perpendicular to the gate data lines, and are led out from both ends to connect to source traces located in the non-display region of the display panel respectively. Because the gate traces and the source traces are distributed in the non-display region of the TFT array substrate, the area of the non-display region cannot be further reduced, and the screen ratio cannot be further improved.

Figure 3:
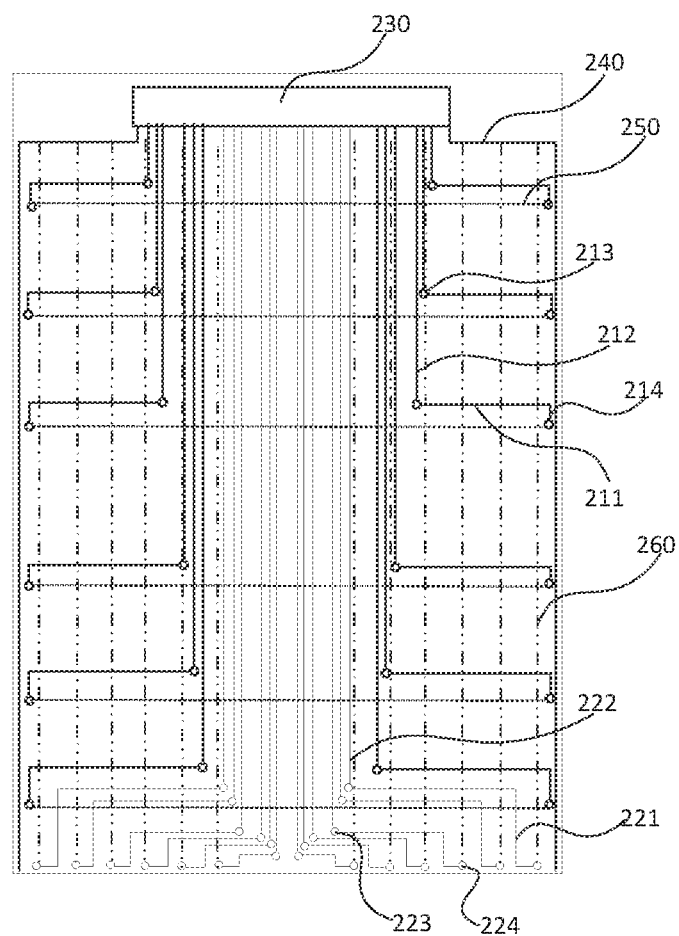
FIG. 3 is a structural diagram of a TFT array substrate of the present invention.

Therefore, the present application provides a TFT array substrate to solve the technical problem that the screen ratio of the display panel cannot be further improved. As shown in FIG. 3, the present application provides a TFT array substrate, and the TFT array substrate includes: a plurality of gate signal lines 150 gate signal lines 250, a plurality of source signal lines 160 source signal lines 260, a plurality of gate traces, and a plurality of source traces. The application will be described in detail below with reference to the accompanying drawings.

As shown in FIG. 1 and FIG. 3, FIG. 1 is a structural diagram of a transistor of a TFT array substrate of the present invention, FIG. 3 is a structural diagram of a TFT array substrate of the present invention. As shown in FIG. 1, the TFT array substrate includes, in an order from bottom to top, a substrate 100, a buffer layer 110, an active region 130, an interlayer dielectric layer 150, a first insulating layer 170, and a second insulating layer 190. Wherein a source 120b, a gate 120a, and a drain 130c are located in the active region 130. The source 120b is connected to a source signal line 260 through a source via hole and a metal plug 180 located in the source via hole. The gate 120a is connected to a gate signal line 250 through a gate via hole and a metal plug 140 located in the gate via hole. Wherein the gate signal line 250 is located in a first planar layer, specifically, the first planar layer is the first insulating layer 170 located above the interlayer dielectric layer 150, a second planar layer is the second insulating layer 190 located above the first insulating layer 170.

The gate signal lines 250 are located in the first planar layer (i.e., the first insulating layer 170) and are disposed in parallel with each other; the source signal lines 260 are located in the second planar layer (i.e., the second insulating layer 190) and are disposed in parallel with each other. the source signal lines 260 are perpendicular to the gate signal lines 250. A number of the source signal lines 260 is equal to a number of the source traces; a number of the gate signal lines 250 is equal to a number of the gate traces.

The gate traces including a plurality of first gate traces 211 in the first planar layer, a plurality of second gate traces 212 in the second planar layer, a plurality of first gate trace holes 213 electrically connecting the first gate traces 211 and the second gate traces 212, and a plurality of second gate trace holes 214 electrically connecting the gate signal lines 250 and the first gate traces 211. Wherein the first gate traces 211 are disposed in parallel with the gate signal lines 250 and are electrically insulated from the gate signal lines 250; the second gate traces 212 are disposed in parallel with the source signal lines 260 and are electrically insulated from the source signal lines 260.

The first gate trace holes 213 are electrically insulated from each other and penetrate an insulating layer between the first gate traces 211 and the second gate traces 212 to implement the electrical connection between the first gate traces 211 and the second gate traces 212 and to form the gate traces.

The second gate trace holes 214 are electrically insulated from each other and penetrate an insulating layer (i.e., the interlayer dielectric layer 150) between the first gate traces 211 and the gate signal lines 250 to implement the electrical connection between the first gate traces 211 and the gate signal lines 250.

The source traces including a plurality of first source traces 221 in the first planar layer, a plurality of second source traces 222 in the second planar layer, a plurality of first source trace holes 223 connecting the first source traces 221 and the second source traces 222, and a plurality of second source trace holes 224 connecting the source signal lines 260 and the first source traces 221.

The first source traces 221 are disposed in parallel with the gate signal lines 250 and are electrically insulated from the gate signal lines 250; the second source traces 222 are disposed in parallel with the source signal lines 260 and are electrically insulated from the source signal lines 260.

The first source trace holes 223 are electrically insulated from each other and penetrate the first insulating layer 170 between the first source traces 221 and the second source traces 222 to implement the electrical connection between the first source traces 221 and the second source traces 222.

The second source trace holes 224 are electrically insulated from each other and penetrate an insulating layer (i.e., the interlayer dielectric layer 150) between the first source traces 221 and the source signal lines 260 to implement the electrical connection between the first source traces 221 and the source signal lines 260.

Preferably, as shown in FIG. 3, the TFT array substrate further includes a bonding region 230 and a plurality of ground traces 240, wherein an end of each of the gate traces is electrically connected to one of the gate signal lines 250, and the other end thereof extends into the bonding region 230, and an end of each of the source traces is electrically connected to one of the source signal lines 260, and the other end thereof extends into the bonding region 230; the ground traces 240 are extended from bases of the TFT array substrate and extend along an edge of the TFT array substrate to the bonding region 230.

Correspondingly, the present application further provides a display panel, wherein the display panel includes a TFT array substrate, the TFT array substrate includes:

a plurality of gate signal lines 250, the gate signal lines 250 being disposed in a first planar layer and parallel to each other;

a plurality of source signal lines 160, the source signal lines 260 being disposed in a second planar layer and parallel to each other, the source signal lines 260 being perpendicular to the gate signal lines 250;

a plurality of gate traces, the gate traces including a plurality of first gate traces 211 in the first planar layer, a plurality of second gate traces 212 in the second planar layer, a plurality of first gate trace holes 213 electrically connecting the first gate traces 211 and the second gate traces 212, and a plurality of second gate trace holes 214 electrically connecting the gate signal lines 250 and the first gate traces 211;

a plurality of source traces, the source traces including a plurality of first source traces 221 in the first planar layer, a plurality of second source traces 222 in the second planar layer, a plurality of first source trace holes 223 electrically connecting the first source traces 221 and the second source traces 222, and a plurality of second source trace holes 224 electrically connecting the source signal lines 260 and the first source traces 221.

The gate signal lines 250 are located in a first planar layer (i.e., the first insulating layer 170) and are disposed in parallel with each other; the source signal lines 260 are located in the second planar layer (i.e., the second insulating layer 190) and are disposed in parallel with each other. The source signal lines 260 are perpendicular to the gate signal lines 250. A number of the source signal lines 260 is equal to a number of the source traces; a number of the gate signal lines 250 is equal to a number of the gate traces.

The gate traces including a plurality of first gate traces 211 in the first planar layer, a plurality of second gate traces 212 in the second planar layer, a plurality of first gate trace holes 213 electrically connecting the first gate traces 211 and the second gate traces 212, and a plurality of second gate trace holes 214 electrically connecting the gate signal lines 250 and the first gate traces 211. Wherein the first gate traces 211 are disposed in parallel with the gate signal lines 250 and are electrically insulated from the gate signal lines 250; the second gate traces 212 are disposed in parallel with the source signal lines 260 and are electrically insulated from the source signal lines 260.

The first gate trace holes 213 are electrically insulated from each other and penetrate an insulating layer between the first gate traces 211 and the second gate traces 212 to implement the electrical connection between the first gate traces 211 and the second gate traces 212 and to form the gate traces.

The second gate trace holes 214 are electrically insulated from each other and penetrate an insulating layer (i.e., the interlayer dielectric layer 150) between the first gate traces 211 and the gate signal lines 250 to implement the electrical connection between the first gate traces 211 and the gate signal lines 250.

The source traces including a plurality of first source traces 221 in the first planar layer, a plurality of second source traces 222 in the second planar layer, a plurality of first source trace holes 223 connecting the first source traces 221 and the second source traces 222, and a plurality of second source trace holes 224 connecting the source signal lines 260 and the first source traces 221.

The first source traces 221 are disposed in parallel with the gate signal lines 250 and are electrically insulated from the gate signal lines 250; the second source traces 222 are disposed in parallel with the source signal lines 260 and are electrically insulated from the source signal lines 260.

The first source trace holes 223 are electrically insulated from each other and penetrate the first insulating layer 170 between the first source traces 221 and the second source traces 222 to implement the electrical connection between the first source traces 221 and the second source traces 222.

The second source trace holes 224 are electrically insulated from each other and penetrate an insulating layer (i.e., the interlayer dielectric layer 150) between the first source traces 221 and the source signal lines 260 to implement the electrical connection between the first source traces 221 and the source signal lines 260.

Preferably, as shown in FIG. 3, the TFT array substrate further includes a bonding region 230 and a plurality of ground traces 240, wherein an end of each of the gate traces is electrically connected to one of the gate signal lines 250, and the other end thereof extends into the bonding region 230, and an end of each of the source traces is electrically connected to one of the source signal lines 260, and the other end thereof extends into the bonding region 230; the ground traces 240 are extended from bases of the TFT array substrate and extend along an edge of the TFT array substrate to the bonding region 230.

The present application utilizes the wiring pattern of existing gate data lines and source data lines, and sets the gate traces and the source traces between the plurality of gate data lines and the plurality of source data lines respectively. Therefore, the gate traces and the source traces in the non-display region at the edge of the display panel can be disposed in the display region, which can further reduce the area of the non-display region, and greatly increase the screen ratio of the display panel.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A thin film transistor (TFT) array substrate, wherein the TFT array substrate comprises:
   a plurality of gate signal lines, the gate signal lines being disposed in a first planar layer and parallel to each other;
   a plurality of source signal lines, the source signal lines being disposed in a second planar layer and parallel to each other, the source signal lines being perpendicular to the gate signal lines;
   a plurality of gate traces, the gate traces comprising a plurality of first gate traces in the first planar layer, a plurality of second gate traces in the second planar layer, a plurality of first gate trace holes electrically connecting the first gate traces and the second gate traces, and a plurality of second gate trace holes electrically connecting the gate signal lines and the first gate traces;
   a plurality of source traces, the source traces comprising a plurality of first source traces in the first planar layer, a plurality of second source traces in the second planar layer, a plurality of first source trace holes connecting the first source traces and the second source traces, and a plurality of second source trace holes connecting the source signal lines and the first source traces.

2. The TFT array substrate according to claim 1, wherein the first gate traces are disposed in parallel with the gate signal lines and are electrically insulated from the gate signal lines; the second gate traces are disposed in parallel with the source signal lines and are electrically insulated from the source signal lines.

3. The TFT array substrate according to claim 1, wherein the first source traces are disposed in parallel with the gate signal lines and are electrically insulated from the gate signal lines; the second source traces are disposed in parallel with the source signal lines and are electrically insulated from the source signal lines.

4. The TFT array substrate according to claim 1, wherein the first gate trace holes are electrically insulated from each other and penetrate an insulating layer between the first gate traces and the second gate traces to implement the electrical connection between the first gate traces and the second gate traces and to form the gate traces.

5. The ITT array substrate according to claim 1, wherein the first source trace holes are electrically insulated from each other and penetrate an insulating layer between the first source traces and the second source traces to implement the electrical connection between the first source traces and the second source traces.

6. The TFT array substrate according to claim 1, wherein the second gate trace holes are electrically insulated from each other and penetrate an insulating layer between the first gate traces and the gate signal lines to implement the electrical connection between the first gate traces and the gate signal lines.

7. The TFT array substrate according to claim 1, wherein the second source trace holes are electrically insulated from each other and penetrate an insulating layer between the first source traces and the source signal lines to implement the electrical connection between the first source traces and the source signal lines.

8. The TFT array substrate according to claim 1, wherein the TFT array substrate further comprises a bonding region and a plurality of ground traces, wherein
   an end of each of the gate traces is electrically connected to one of the gate signal lines, and the other end thereof extends into the bonding region, and an end of each of the source traces is electrically connected to one of the source signal lines, and the other end thereof extends into the bonding region;
   the ground traces are extended from bases of the TFT array substrate and extend along an edge of the TFT array substrate to the bonding region.

9. The TFT array substrate according to claim 1, wherein a number of the source signal lines is equal to a number of the source traces, and a number of the gate signal lines is equal to a number of the gate traces.

10. A display panel comprising a TFT array substrate, wherein the TFT array substrate comprises:
    a plurality of gate signal lines, the gate signal lines being disposed in a first planar layer and parallel to each other;

a plurality of source signal lines, the source signal lines being disposed in a second planar layer and parallel to each other, the source signal lines being perpendicular to the gate signal lines;

a plurality of gate traces, the gate traces comprising a plurality of first gate traces in the first planar layer, a plurality of second gate traces in the second planar layer, a plurality of first gate trace holes electrically connecting the first gate traces and the second gate traces, and a plurality of second gate trace holes electrically connecting the gate signal lines and the first gate traces;

a plurality of source traces, the source traces comprising a plurality of first source traces in the first planar layer, a plurality of second source traces in the second planar layer, a plurality of first source trace holes electrically connecting the first source traces and the second source traces, and a plurality of second source trace holes electrically connecting the source signal lines and the first source traces.

11. The display panel according to claim 10, wherein the first gate traces are disposed in parallel with the gate signal lines and are electrically insulated from the gate signal lines, and the second gate traces are disposed in parallel with the source signal lines and are electrically insulated from the source signal lines.

12. The display panel according to claim 10, wherein the first source traces are disposed in parallel with the gate signal lines and are electrically insulated from the gate signal lines; the second source traces are disposed in parallel with the source signal lines and are electrically insulated from the source signal lines.

13. The display panel according to claim 10, wherein the first gate trace holes are electrically insulated from each other and penetrate an insulating layer between the first gate traces and the second gate traces to implement the electrical connection between the first gate traces and the second gate traces and to form the gate traces.

14. The display panel according to claim 10, wherein the first source trace holes are electrically insulated from each other and penetrate an insulating layer between the first source traces and the second source traces to implement the electrical connection between the first source traces and the second source traces.

15. The display panel according to claim 10, wherein the second gate trace holes are electrically insulated from each other and penetrate an insulating layer between the first gate traces and the gate signal lines to implement the electrical connection between the first gate traces and the gate signal lines.

16. The display panel according to claim 10, wherein the second source trace holes are electrically insulated from each other and penetrate an insulating layer between the first source traces and the source signal lines to implement the electrical connection between the first source traces and the source signal lines.

17. The display panel according to claim 10, wherein the display panel further comprises a bonding region and a plurality of ground traces, wherein an end of each of the gate traces is electrically connected to one of the gate signal lines, and the other end thereof extends into the bonding region, and an end of each of the source traces is electrically connected to one of the source signal lines, and the other end extends into the bonding region;

the ground traces are extended from bases of the display panel and extend along an edge of the display panel to the bonding region.

18. The display panel according to claim 10, wherein a number of the source signal lines is equal to a number of the source traces; a number of the gate signal lines is equal to a number of the gate traces.

* * * * *